(12) United States Patent
Dahl (10) Patent No.: US 7,787,634 B1
(45) Date of Patent: Aug. 31, 2010

(54) MUSICAL DISTORTION CIRCUITS

(76) Inventor: Philip Young Dahl, 302 Wedgewood Dr., Mahtomedi, MN (US) 55115-1778

( * ) Notice: Subject to any disclaimer, the term of this patent is extended or adjusted under 35 U.S.C. 154(b) by 1174 days.

(21) Appl. No.: 11/331,660

(22) Filed: Jan. 16, 2006

(51) Int. Cl.
H03G 3/00 (2006.01)
H03G 7/00 (2006.01)
H03F 1/36 (2006.01)

(52) U.S. Cl. .............................. 381/61; 333/14; 330/75; 381/118

(58) Field of Classification Search .................. 381/61, 381/118, 120, 62, 101, 102, 104, 98, 83, 381/111, 106; 330/302, 306, 126, 303, 304, 330/110, 75; 84/735, 711, 692; 333/176, 333/126, 17.2, 14, 28 T
See application file for complete search history.

(56) References Cited

U.S. PATENT DOCUMENTS

| | | | |
|---|---|---|---|
| 4,021,613 A | | 5/1977 | Kennedy |
| 4,050,343 A | | 9/1977 | Moog |
| 4,180,707 A | | 12/1979 | Moog |
| 4,383,229 A | * | 5/1983 | Jones ..................... 333/176 |
| 4,405,832 A | | 9/1983 | Sondermeyer |
| 4,584,700 A | | 4/1986 | Scholz |
| 4,811,401 A | | 3/1989 | Brown, Sr. et al. |
| 4,995,084 A | | 2/1991 | Pritchard |
| 5,022,305 A | | 6/1991 | Butler |
| 5,032,796 A | | 7/1991 | Tiers et al. |
| 5,124,668 A | * | 6/1992 | Christian ................ 330/302 |
| 5,133,014 A | | 7/1992 | Pritchard |
| 5,900,570 A | | 5/1999 | Rossum |
| 5,977,474 A | | 11/1999 | O'Brien |
| 6,091,269 A | | 7/2000 | Rossum |
| 7,390,960 B1 | * | 6/2008 | Arnold ..................... 84/735 |
| 2005/0201573 A1 | * | 9/2005 | Poletti ..................... 381/118 |

OTHER PUBLICATIONS

Keen, R.G., The Technology of the Tube Screamer™, 1998, www.geofex.com.
Keen, R.G., The Technology of the Fuzz Face™, 1998, www.geofex.com.
Smalley, Gustave and Keen, R.G., Schematic reputed to be "Expandora™", Mar. 15, 1999, www.geofex.com.
Philpott, Justin, Craig Anderton's Tube Sound Fuzz (schematic), Feb. 1998.
Strand, Robert, Boss™ Overdrive OD-1™ Schematic, Nov. 29, 2000.
Schmit, P., Boss™ DS-1™ Distortion Schematic, date unknown.
Keen, R.G. and Orman, Jack, MXR™ Distortion+ (schematic), Sep. 1998.
Keen, R.G. and Orman, Jack, ProCo™ Rat™ Distortion (schematic), date unknown.

* cited by examiner

Primary Examiner—Xu Mei
Assistant Examiner—Friedrich Fahnert (57) ABSTRACT

Musical distortion circuits are presented, typically for use with electric guitars, other electronic musical instruments or other sources of audio signals. In one embodiment, the musical distortion circuits of the present disclosure include a non-limiting clipping section. In one embodiment, the musical distortion circuits of the present disclosure include a wave-shaping section. In some embodiments, the musical distortion circuits additionally include pre- or post-distortion or pre- or post-clipping sections.

20 Claims, 8 Drawing Sheets

MUSICAL DISTORTION CIRCUITS

FIELD OF THE DISCLOSURE

The present disclosure concerns non-linear circuits, typically for use with electric guitars, other electronic musical instruments or other sources of audio signals, and typically for use in the creation of musical distortion.

BACKGROUND OF THE DISCLOSURE

It has long been appreciated that electric guitar amplifiers do more than make guitars louder. When driven to non-linearity or distortion, they add harmonic content that may improve the aesthetic appeal of the guitar sound. This is primarily the result of the limited ability of the amplifier to continuously track the input signal at high gain. As a result, the peaks of the signal waveform are rounded over or clipped off.

It has also been long appreciated that deliberately non-linear or distorting circuits may be connected in the signal chain between guitar and amplifier—"fuzz pedals" and the like—to obtain improvements in the aesthetic appeal of the guitar sound. Some distortion circuits are, in essence, amplifiers deliberately designed to operate in an overloaded state. Other distortion circuits use clipping diodes to create distortion. These circuits take advantage of the "diode drop" characteristic of diodes: A diode will not pass a substantial current in the forward direction until the forward voltage exceeds a certain minimum, called the forward voltage drop or "diode drop." For silicon (Si) diodes, the diode drop is typically about 0.6 volts; for germanium (Ge) diodes, typically about 0.35 volts. Some diode distortion circuits include a clipping section that includes an anti-parallel pair of diodes connected between a signal conductor and ground. Any part of the signal that does not exceed plus or minus one diode drop is unchanged. However, when the signal exceeds plus or minus one diode drop, the diodes conduct to ground, clipping off the waveform peaks at plus or minus one diode drop. Other diode distortion circuits include a clipping section that includes an op amp and an anti-parallel pair of diodes in the feedback loop of the op amp, i.e., connected between the output and the inverting input. When the difference between the voltage at the output and the voltage at the inverting input exceeds plus or minus one diode drop, the diodes conduct, reducing the gain of the amplifier to one (in the non-inverting amplifier configuration) or zero (in the inverting amplifier configuration).

A number of U.S. patents have been issued purportedly disclosing various distortion circuits for use with musical instruments, including: U.S. Pat. No. 4,584,700; U.S. Pat. No. 4,021,613; U.S. Pat. No. 4,050,343; U.S. Pat. No. 4,180,707; U.S. Pat. No. 4,405,832; U.S. Pat. No. 4,811,401; U.S. Pat. No. 4,995,084; U.S. Pat. No. 5,022,305; U.S. Pat. No. 5,032,796; U.S. Pat. No. 5,133,014; U.S. Pat. No. 5,900,570; U.S. Pat. No. 5,977,474; U.S. Pat. No. 6,091,269.

SUMMARY

Briefly, the present disclosure provides a musical distortion circuit comprising a non-limiting clipping section comprising: a) a non-limiting clipping section input and a non-limiting clipping section output; b) first, second and third capacitors connected in series between the non-limiting clipping section input and the non-limiting clipping section output; c) at least one first clipping diode connected between 1) a point of connection between the first and second capacitors, and 2) a first reference voltage; d) at least one second clipping diode connected between 1) a point of connection between the second and third capacitors, and 2) a second reference voltage, the first and second clipping diodes being connected in anti-parallel orientation; and e) a impedance connected between 1) the point of connection between the first and second capacitors, and 2) the point of connection between the second and third capacitors, wherein the impedance is a non-zero impedance that is finite at DC. In some embodiments, the impedance is substantially entirely resistive or may comprises a variable resistance. In some embodiments, the first and second reference voltages are both equal to ground or to a virtual ground. In some embodiments, the musical distortion circuit additionally comprises f) an input amplifier connected between a musical distortion circuit input and the non-limiting clipping section input; and g) an output amplifier connected between the non-limiting clipping section output and a musical distortion circuit output.

In another aspect, the present disclosure provides a musical distortion circuit comprising a waveshaping section comprising: a) a waveshaping section input and a waveshaping section output; b) a differential amplifier having an inverting amplifier input, a non-inverting amplifier input, and an amplifier output; c) a feedback impedance connected between the inverting amplifier input and the amplifier output; d) a first input impedance connected between the waveshaping section input and the inverting amplifier input; e) a second input impedance connected between the waveshaping section input and the non-inverting amplifier input; f) a gain impedance connected between the inverting amplifier input and a reference voltage; and g) at least one first diode connected between the non-inverting amplifier input and the reference voltage. In some embodiments, the at least one first diode comprises two anti-parallel diodes. In some embodiments, the musical distortion circuit additionally comprises: h) at least one second diode connected between the inverting amplifier input and the amplifier output, which is typically two anti-parallel diodes, and may be three or more diodes in series-anti-parallel connection, most typically four diodes in series-anti-parallel connection. Typically the first input impedance is substantially entirely resistive, and may be adjustable. Typically the second input impedance is substantially entirely resistive, and may be adjustable. Typically the gain impedance is substantially entirely resistive, and may be adjustable. Typically the feedback impedance is substantially entirely resistive, and may be adjustable. In some embodiments, the ratio of the feedback impedance to the first input impedance is less than one plus the ratio of the feedback impedance to the gain impedance, or, more typically, less than two plus twice the ratio of the feedback impedance to the gain impedance. In some embodiments, the reference voltage is ground or a virtual ground. In some embodiments, the musical distortion circuit additionally comprises: i) an input amplifier connected between a musical distortion circuit input and the waveshaping section input. In some embodiments, the musical distortion circuit additionally comprises: j) an output amplifier connected between the waveshaping section output and a musical distortion circuit output. In some embodiments, the musical distortion circuit additionally comprises: k) a distortion section connected between a musical distortion circuit input and the waveshaping section input. In some embodiments, the musical distortion circuit additionally comprises: l) an input amplifier and a distortion section connected in series between a musical distortion circuit input and the waveshaping section input. In some embodiments, the musical distortion circuit additionally comprises: m) a distortion section connected between the waveshaping section output and a musical distortion circuit output.

In another aspect, the present disclosure provides a musical distortion circuit comprising a waveshaping section comprising: a) a waveshaping section input and a waveshaping section output; b) a differential amplifier having an inverting amplifier input, a non-inverting amplifier input, and an amplifier output; c) a feedback impedance connected between the inverting amplifier input and the amplifier output; d) an input impedance connected between the waveshaping section input and the inverting amplifier input; e) a gain impedance connected between the inverting amplifier input and a reference voltage; f) a reference impedance connected between the non-inverting amplifier input and the reference voltage; and g) at least one first diode connected between the waveshaping section input and the non-inverting amplifier input. In some embodiments, the at least one first diode comprises two antiparallel diodes. In some embodiments, the musical distortion circuit additionally comprises: h) at least one second diode connected between the inverting amplifier input and the amplifier output, which is typically two anti-parallel diodes, and may be three or more diodes in series-anti-parallel connection, most typically four diodes in series-anti-parallel connection. Typically the input impedance is substantially entirely resistive, and may be adjustable. Typically the reference impedance is substantially entirely resistive, and may be adjustable. Typically the gain impedance is substantially entirely resistive, and may be adjustable. Typically the feedback impedance is substantially entirely resistive, and may be adjustable. In some embodiments, the ratio of the feedback impedance to the input impedance is greater than one plus the ratio of the feedback impedance to the gain impedance, and more typically greater than two plus twice the ratio of the feedback impedance to the gain impedance. In some embodiments, the reference voltage is ground or a virtual ground. In some embodiments, the musical distortion circuit additionally comprises: i) an input amplifier connected between a musical distortion circuit input and the waveshaping section input. In some embodiments, the musical distortion circuit additionally comprises: j) an output amplifier connected between the waveshaping section output and a musical distortion circuit output. In some embodiments, the musical distortion circuit additionally comprises: k) a distortion section connected between a musical distortion circuit input and the waveshaping section input. In some embodiments, the musical distortion circuit additionally comprises: l) an input amplifier and a distortion section connected in series between a musical distortion circuit input and the waveshaping section input. In some embodiments, the musical distortion circuit additionally comprises: m) a distortion section connected between the waveshaping section output and a musical distortion circuit output.

DETAILED DESCRIPTION

The present disclosure concerns musical distortion circuits, including musical distortion circuits including a non-limiting clipping section according to the present disclosure and musical distortion circuits including a waveshaping section according to the present disclosure.

Musical Distortion Circuit with Non-Limiting Clipping Section

Figure 1:
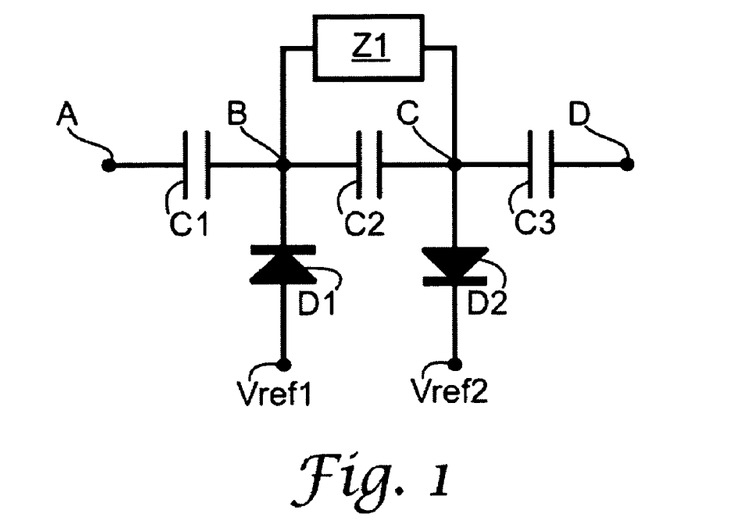
FIG. 1 is electronic circuit schematic of a non-limiting clipping section according to the present disclosure.

With reference to FIG. 1, a non-limiting clipping section according to the present disclosure includes capacitors C1, C2 and C3 connected in series between section input A and section output D, and connecting at midpoints B and C. In some embodiments, additional impedances may connect points A, B, C and D in series or parallel with capacitors C1, C2 and C3, so long as DC current is essentially blocked between points A and B and points C and D. Diode D1 connects point B with reference voltage Vref1. Diode D2 connects point C with reference voltage Vref2. Reference voltages Vref1 and Vref2 may be the same or different. In some embodiments, reference voltages Vref1 and Vref2 are both ground. In some embodiments, reference voltages Vref1 and Vref2 are the same or different virtual grounds. In some embodiments, reference voltages Vref1 and Vref2 are both a virtual ground equal to about half of the supply voltage for the entire circuit. In some embodiments, reference voltages Vref1 and Vref2 are both a virtual ground equal to about 55% of the supply voltage for the entire circuit. Virtual ground voltages may be supplied by any suitable circuit, including those employing voltage dividers, Zener diodes, op-amps, voltage regulators, or combinations thereof. In some embodiments, additional impedances may connect point B with reference voltage Vref1 in series or parallel with diode D1 so long as they do not interfere with the operation of the section as described herein. In some embodiments, additional impedances may connect point C with reference voltage Vref2 in series or parallel with diode D2 so long as they do not interfere with the operation of the section as described herein. As illustrated in FIG. 1, diodes D1 and D2 are in anti-parallel orientation relative to each other. Diodes D1 and D2 may be reversed in orientation from that depicted in FIG. 1, but should remain anti-parallel to each other. Impedance Z1 connects points B and C, in parallel with capacitor C2. Impedance Z1 is a non-zero impedance that is finite at DC. Impedance Z1 may be resistive, reactive, or a combination of both. In some embodiments, impedance Z1 is substantially entirely resistive, that is, it no more reactive than physical resistors or potentiometers. In some embodiments, impedance Z1 is or includes a variable resistance or potentiometer, and is therefore adjustable.

In some embodiments, an input signal is applied at section input A and a processed signal is obtained at section output D. The processed signal is clipped whenever the input signal is greater than a positive-going clipping point or less than a negative-going clipping point. However, the gap between the positive-going and negative-going clipping points in the non-limiting clipping section according to the present invention is not constant, but varies with the amplitude of the input signal, increasing with increasing input signal amplitude and decreasing with decreasing input signal amplitude. Thus, the clipping section according to the present invention does not act as a limiter preventing the output from exceeding a certain fixed amplitude.

Without wishing to be bound by theory, it is believed that the non-limiting clipping section according to the present invention functions as follows. The non-limiting clipping section according to the present invention differs from typical diode clippers by the insertion of capacitor C2 and impedance Z1 in parallel between points B and C, i.e., between the clipping diodes D1 and D2. The insertion of capacitor C2 between points B and C allows points B and C to exist at different bias voltages. When an audio signal is applied at section input A, diode D1 clips only negative-going peaks by allowing current to flow from Vref1 to point B. As a result of that current, the bias voltage at B increases, and therefore the signal amplitude needed before any subsequent negative-going peaks will be clipped also increases. Likewise, when an audio signal is applied at section input A, diode D2 clips only positive-going peaks by allowing current to flow from point C to Vref2. As a result of that current, the bias voltage at point C decreases, and therefore the signal amplitude needed before any subsequent positive-going peaks will be clipped also decreases. Impedance Z1 allows current to flow between points B and C, thereby equalizing the different bias voltages at points B and C, over a controlled period of time determined by the magnitude of Z1 and the capacitor values.

In some embodiments, the non-limiting clipping section according to the present disclosure may be part of a larger circuit comprising additional sections or parts, which may include input devices, output devices, input amplifiers, output amplifiers, passive or active filters, or other signal processing sections which may be functionally connected to each other or to section input A or to section output D. Any suitable additional sections or parts may be used.

Musical Distortion Circuit with Waveshaping Section

The waveshaping section according to the present disclosure may be one of two types, Type I and Type II, and is more typically Type I.

Figure 2:
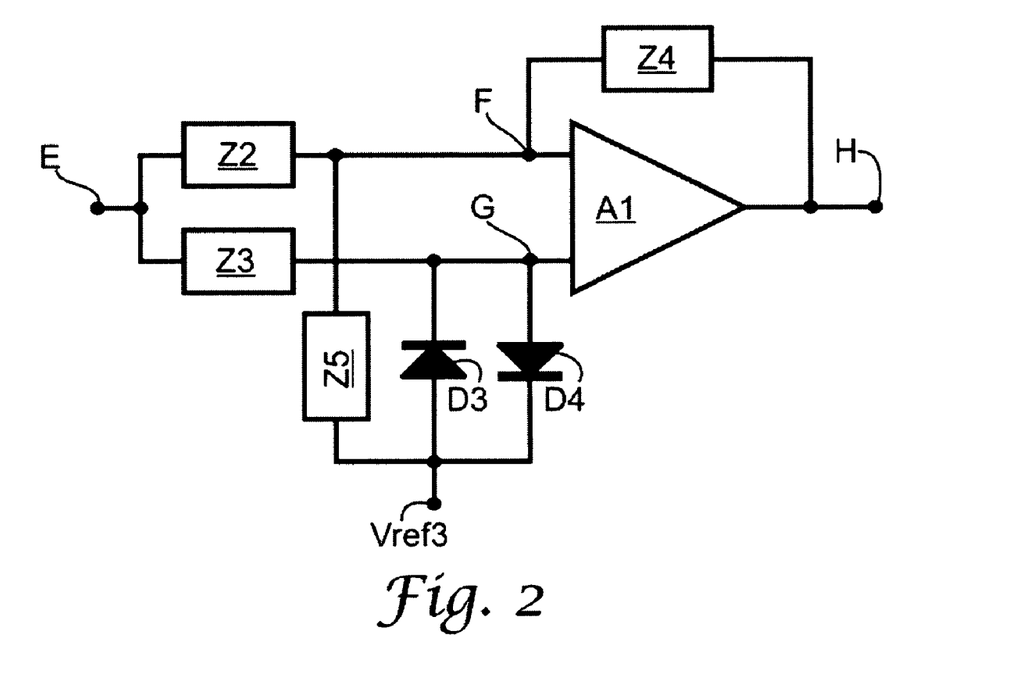
FIG. 2 is electronic circuit schematic of a Type I waveshaping section according to the present disclosure.

With reference to FIG. 2, a Type I waveshaping section according to the present disclosure includes differential amplifier A1 having inverting amplifier input F, non-inverting amplifier input G, and amplifier output H. Amplifier output H is the waveshaping section output. Any suitable differential amplifier can be used. The differential amplifier may include discrete solid state components, vacuum tubes, IC's, or any combination of thereof. Most typically an IC op-amp is used.

It will be understood that differential amplifier A1 is provided with appropriate power supply.

Waveshaping section input E is connected to inverting amplifier input F by first input impedance Z2. First input impedance Z2 may be resistive, reactive, or a combination of both. In some embodiments, first input impedance Z2 is substantially entirely resistive, that is, it no more reactive than physical resistors or potentiometers. In some embodiments, first input impedance Z2 is or includes a variable resistance or potentiometer, and is therefore adjustable.

Waveshaping section input E is connected to non-inverting amplifier input G by second input impedance Z3. Second input impedance Z3 may be resistive, reactive, or a combination of both. In some embodiments, second input impedance Z3 is substantially entirely resistive, that is, it no more reactive than physical resistors or potentiometers. In some embodiments, second input impedance Z3 is or includes a variable resistance or potentiometer, and is therefore adjustable.

Feedback impedance Z4 connects inverting amplifier input F and amplifier output H. Feedback impedance Z4 may be resistive, reactive, or a combination of both. In some embodiments, feedback impedance Z4 is substantially entirely resistive, that is, it no more reactive than physical resistors or potentiometers. In some embodiments, feedback impedance Z4 is or includes a variable resistance or potentiometer, and is therefore adjustable.

Inverting amplifier input F is connected to reference voltage Vref3 by gain impedance Z5. Gain impedance Z5 may be resistive, reactive, or a combination of both. In some embodiments, gain impedance Z5 is substantially entirely resistive, that is, it no more reactive than physical resistors or potentiometers. In some embodiments, gain impedance Z5 is or includes a variable resistance or potentiometer, and is therefore adjustable. In some embodiments, reference voltage Vref3 is ground. In some embodiments, reference voltage Vref3 is a virtual ground. In some embodiments, reference voltage Vref3 is a virtual ground equal to about half of the supply voltage for the entire circuit. In some embodiments, reference voltage Vref3 is a virtual ground equal to about 55% of the supply voltage for the entire circuit. Virtual ground voltages may be supplied by any suitable circuit, including those employing voltage dividers, Zener diodes, op-amps, voltage regulators, or combinations thereof.

Non-inverting amplifier input G is connected to reference voltage Vref3 by at least one diode D3, and more typically at least one anti-parallel pair of diodes D3, D4. In some embodiments, additional impedances may connect non-inverting amplifier input G with reference voltage Vref3 in series or parallel with diode(s) D3 (and D4) so long as they do not interfere with the operation of the section as described herein. As illustrated in FIG. 2, diodes D3 and D4 are in anti-parallel orientation relative to each other. Diodes D3 and D4 may be reversed in orientation from that depicted in FIG. 2, but in most embodiments should remain anti-parallel to each other.

In some embodiments, the waveshaping section according to the present disclosure may be part of a larger circuit comprising additional sections or parts, which may include input devices, output devices, input amplifiers, output amplifiers, passive or active filters, or other signal processing sections which may be functionally connected to each other or to waveshaping section input E or to waveshaping section output H. Any suitable additional sections or parts may be used.

In some embodiments, the waveshaping section according to the present disclosure is preceded by a pre-distortion or pre-clipping section directly or indirectly connected to waveshaping section input E, which distorts or clips the input signal before it is processed in the waveshaping section. Any suitable distortion or clipping section can be used, including overdriven amplifier distortion, diode clipping distortion, and the like.

In some embodiments, the waveshaping section according to the present disclosure is followed by a post-distortion or post-clipping section directly or indirectly connected to waveshaping section output H, which distorts or clips the input signal after it is processed in the waveshaping section. Any suitable distortion or clipping section can be used, including overdriven amplifier distortion, diode clipping distortion, and the like. In some embodiments, one or more clipping diodes are connected between inverting amplifier input F and amplifier output H to provide post-distortion (post-clipping), more typically at least two anti-parallel diodes, and in some embodiments three, four, or more diodes in any series-anti-parallel connection.

Without wishing to be bound by theory, it is believed that the waveshaping section according to the present invention functions as follows. When an audio input signal is applied at waveshaping section input E which does not differ in voltage from Vref3 by more than the forward voltage drop (diode drop) across diodes D3 or D4, the diodes remain closed. As a result, the waveshaping section acts as a non-inverting amplifier with a gain of about $(1+Z4/Z5)$. However, when peaks of the audio input signal exceed the forward voltage drop (diode drop) across diodes D3 or D4, the diodes conduct current and hold the voltage at non-inverting input G to Vref3. As a result, the waveshaping section becomes an inverting amplifier with a gain of about $(-Z4/Z2)$ and an offset of the associated diode drop times $(1+Z4/Z5+Z4/Z2)$.

In theory, where D3 and D4 are diodes each having a forward voltage drop of dd and Vref3 is ground, the output voltage (Vout) at waveshaping section output H, for an input voltage (Vin) at waveshaping section input E of between +dd and −dd, is:

$$Vout=Vin(1+Z4/Z5)$$

for Vin of greater than +dd, Vout is:

$$Vout=Vin(-Z4/Z2)+dd(1+Z4/Z5+Z4/Z2)$$

and for Vin of less than −dd, Vout is:

$$Vout=Vin(-Z4/Z2)-dd(1+Z4/Z5+Z4/Z2)$$

Because the transition of a diode from non-conducting to conducting may not be immediate, the transfer function of Vout as a function of Vin may be rounded for values of Vin close to +dd or −dd.

Figure 4:
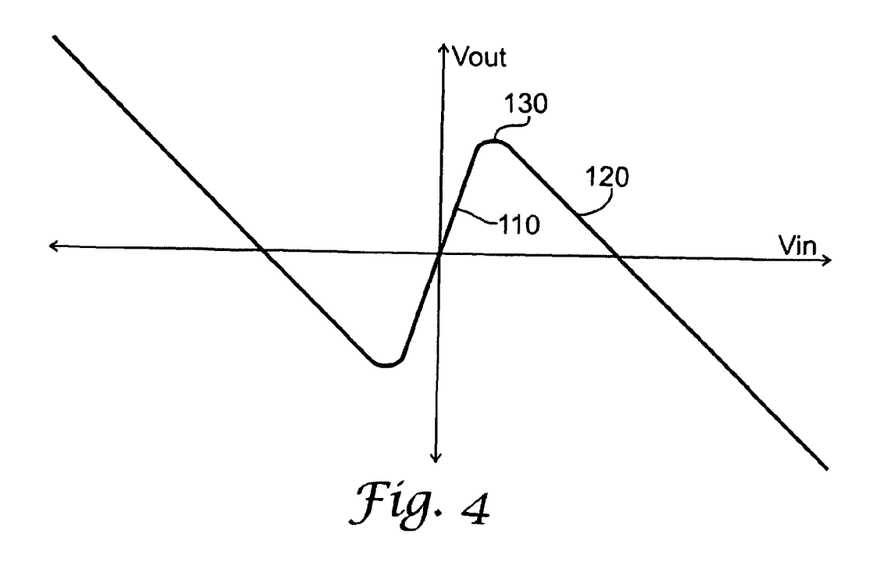
FIG. 4 schematically represents a transfer function for a Type I waveshaping section according to the present disclosure, with input voltage plotted on the horizontal axis and output voltage plotted on the vertical axis.
Figure 8:
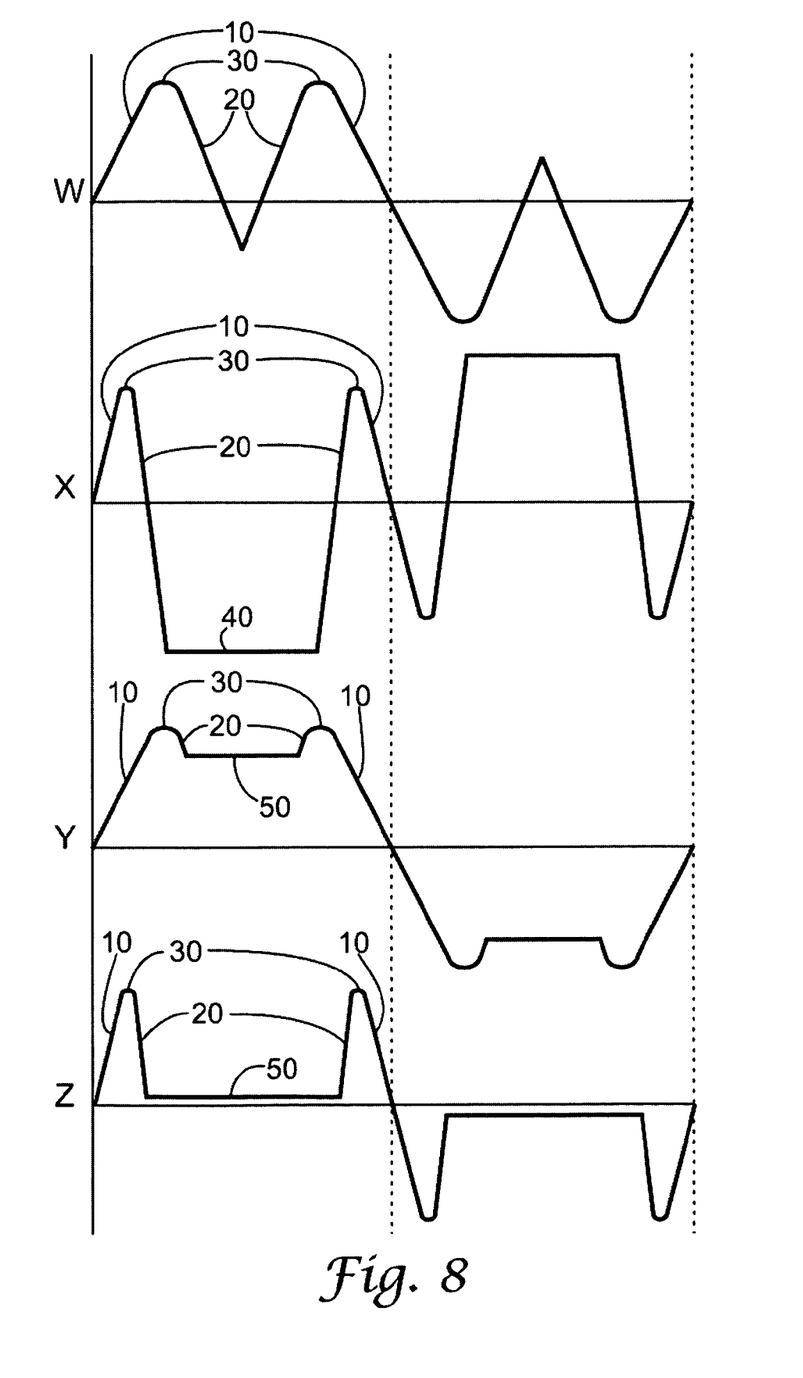
FIG. 8 schematically represents four waveforms which are the result of processing a triangle wave through various Type I waveshaping sections according to the present disclosure.

FIG. 4 schematically represents a transfer function for such a waveshaping section, with input voltage plotted on the horizontal axis and output voltage plotted on the vertical axis, including non-inverting portion 110, inverting portion 120, and transitional portion 130. Waveform W of FIG. 8 schematically represents a "folded" waveform obtained by processing a triangle wave through such a waveshaping section, including non-inverted portion 10, inverted portion 20, and transitional portion 30.

In some embodiments, $(Z4/Z2)$ is less than $(1+Z4/Z5)$. In some embodiments, $(Z4/Z2)$ is less than twice $(1+Z4/Z5)$, or less than three times $(1+Z4/Z5)$, or less than four times $(1+Z4/Z5)$.

Figure 5:
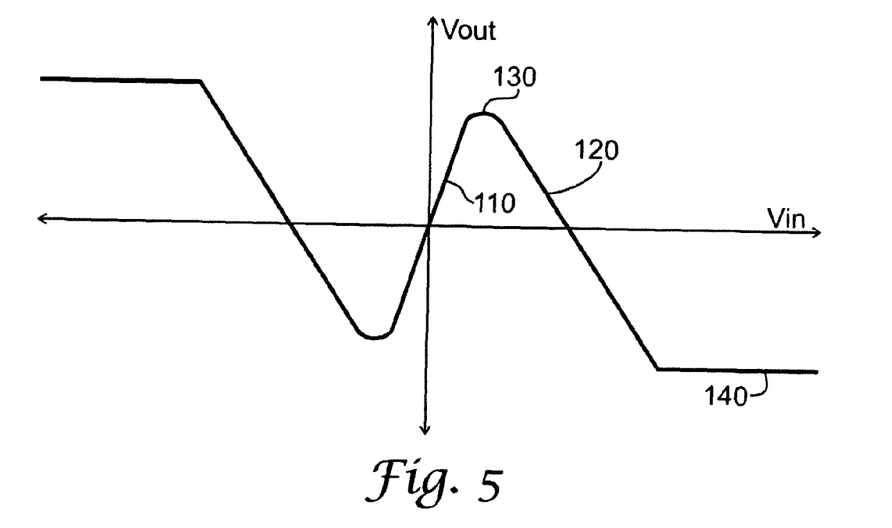
FIG. 5 schematically represents a transfer function for a Type I waveshaping section according to the present disclosure, with input voltage plotted on the horizontal axis and output voltage plotted on the vertical axis.

FIG. 5 schematically represents a transfer function for a similar waveshaping section additionally including post-clipping, as described above. The transfer function includes non-inverting portion 110, inverting portion 120, transitional portion 130, and clipped portion 140. Waveform X of FIG. 8 schematically represents a folded and clipped waveform obtained by processing a triangle wave through such a waveshaping section with post-clipping, including non-inverted portion 10, inverted portion 20, transitional portion 30, and clipped portion 40.

Figure 6:
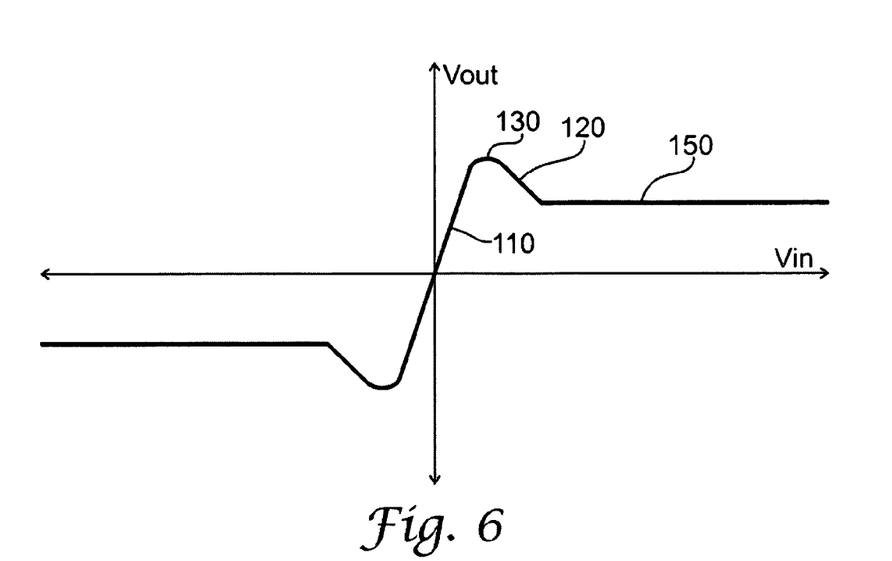
FIG. 6 schematically represents a transfer function for a Type I waveshaping section according to the present disclosure, with input voltage plotted on the horizontal axis and output voltage plotted on the vertical axis.

FIG. 6 schematically represents a transfer function for a similar waveshaping section including pre-clipping, as described above. The transfer function includes non-inverting portion 110, inverting portion 120, transitional portion 130, and pre-clipped portion 150. Waveform Y of FIG. 8 schematically represents a pre-clipped and folded waveform obtained by processing a triangle wave through such a waveshaping section with pre-clipping, including non-inverted portion 10, inverted portion 20, transitional portion 30, and pre-clipped portion 50.

Figure 7:
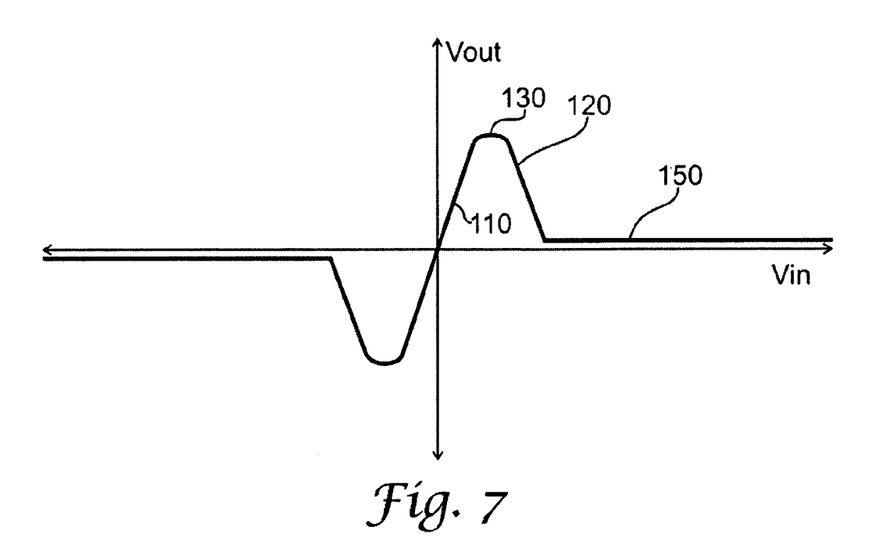
FIG. 7 schematically represents a transfer function for a Type I waveshaping section according to the present disclosure, with input voltage plotted on the horizontal axis and output voltage plotted on the vertical axis.

FIG. 7 schematically represents a transfer function for a particular case of a waveshaping section including pre-clipping, as described above. The transfer function includes non-inverting portion 110, inverting portion 120, transitional portion 130, and pre-clipped portion 150. Waveform Z of FIG. 8 schematically represents a pre-clipped and folded waveform obtained by processing a triangle wave through such a waveshaping section with pre-clipping, including non-inverted portion 10, inverted portion 20, transitional portion 30, and pre-clipped portion 50. In this case, pre-clipped portion 50 is folded to where it is at or near the waveform midpoint, greatly reducing the fundamental frequencies in the original signal.

Figure 3:
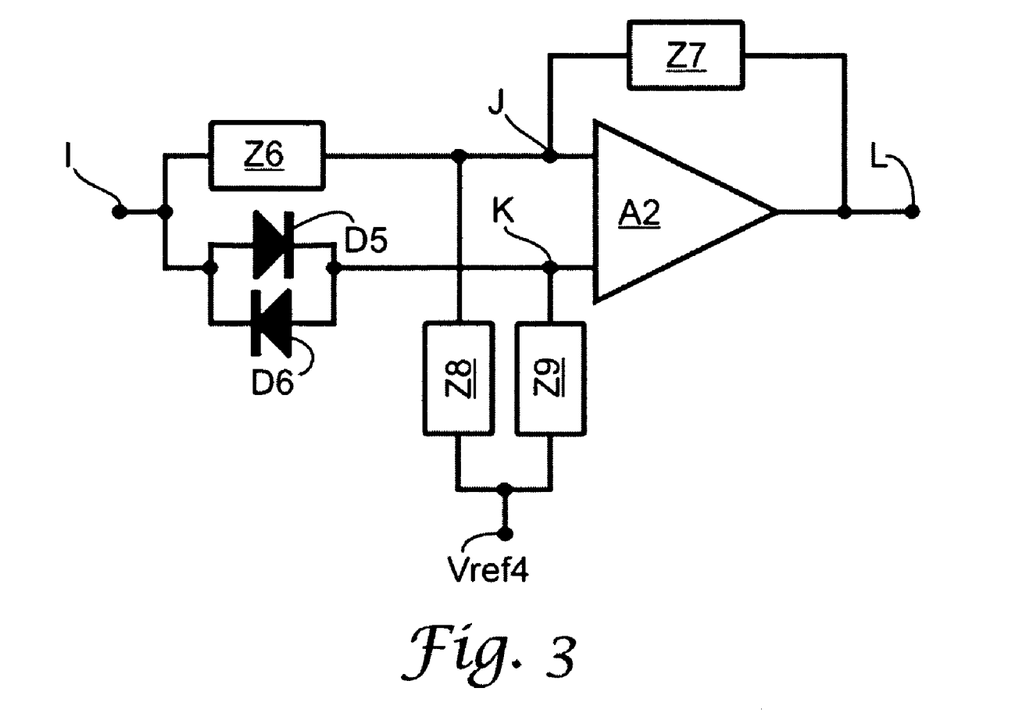
FIG. 3 is electronic circuit schematic of a Type II waveshaping section according to the present disclosure.

With reference to FIG. 3, a Type II waveshaping section according to the present disclosure includes differential amplifier A2 having inverting amplifier input J, non-inverting amplifier input K, and amplifier output L. Amplifier output L is the waveshaping section output. Any suitable differential amplifier can be used. The differential amplifier may include discrete solid state components, vacuum tubes, IC's, or any combination of thereof. Most typically an IC op-amp is used. It will be understood that differential amplifier A2 is provided with appropriate power supply.

Waveshaping section input I is connected to inverting amplifier input J by input impedance Z6. Input impedance Z6 may be resistive, reactive, or a combination of both. In some embodiments, input impedance Z6 is substantially entirely resistive, that is, it no more reactive than physical resistors or potentiometers. In some embodiments, input impedance Z6 is or includes a variable resistance or potentiometer, and is therefore adjustable.

Feedback impedance Z7 connects inverting amplifier input J and amplifier output L. Feedback impedance Z7 may be resistive, reactive, or a combination of both. In some embodiments, feedback impedance Z7 is substantially entirely resistive, that is, it no more reactive than physical resistors or potentiometers. In some embodiments, feedback impedance Z7 is or includes a variable resistance or potentiometer, and is therefore adjustable.

Inverting amplifier input J is connected to reference voltage Vref4 by gain impedance Z8. Gain impedance Z8 may be resistive, reactive, or a combination of both. In some embodiments, gain impedance Z8 is substantially entirely resistive, that is, it no more reactive than physical resistors or potentiometers. In some embodiments, gain impedance Z8 is or includes a variable resistance or potentiometer, and is therefore adjustable. In some embodiments, reference voltage Vref4 is ground. In some embodiments, reference voltage Vref4 is a virtual ground. In some embodiments, reference voltage Vref4 is a virtual ground equal to about half of the supply voltage for the entire circuit. In some embodiments, reference voltage Vref4 is a virtual ground equal to about 55% of the supply voltage for the entire circuit. Virtual ground voltages may be supplied by any suitable circuit, including those employing voltage dividers, Zener diodes, op-amps, voltage regulators, or combinations thereof.

Non-inverting amplifier input K is connected to reference voltage Vref4 by reference impedance Z9. Reference impedance Z9 may be resistive, reactive, or a combination of both. In some embodiments, reference impedance Z9 is substantially entirely resistive, that is, it no more reactive than physical resistors or potentiometers. In some embodiments, reference impedance Z9 is or includes a variable resistance or potentiometer, and is therefore adjustable.

Non-inverting amplifier input K is connected to waveshaping section input I by at least one diode D5, and more typically at least one anti-parallel pair of diodes D5, D6. In some embodiments, additional impedances may connect non-inverting amplifier input K with waveshaping section input I in series or parallel with diode(s) D5 (and D6) so long as they do not interfere with the operation of the section as described herein. As illustrated in FIG. 2, diodes D5 and D6 are in anti-parallel orientation relative to each other. Diodes D5 and D6 may be reversed in orientation from that depicted in FIG. 3, but in most embodiments should remain anti-parallel to each other.

In some embodiments, the waveshaping section according to the present disclosure may be part of a larger circuit comprising additional sections or parts, which may include input devices, output devices, input amplifiers, output amplifiers, passive or active filters, or other signal processing sections which may be functionally connected to each other or to waveshaping section input I or to waveshaping section output L. Any suitable additional sections or parts may be used.

In some embodiments, the waveshaping section according to the present disclosure is preceded by a pre-distortion or pre-clipping section directly or indirectly connected to waveshaping section input I, which distorts or clips the input signal before it is processed in the waveshaping section. Any suitable distortion or clipping section can be used, including overdriven amplifier distortion, diode clipping distortion, and the like.

In some embodiments, the waveshaping section according to the present disclosure is followed by a post-distortion or post-clipping section directly or indirectly connected to waveshaping section output L, which distorts or clips the input signal after it is processed in the waveshaping section. Any suitable distortion or clipping section can be used, including overdriven amplifier distortion, diode clipping distortion, and the like. In some embodiments, one or more clipping diodes are connected between inverting amplifier input J and amplifier output L to provide post-distortion (post-clipping), more typically at least two anti-parallel diodes, and in some embodiments three, four, or more diodes in any series-anti-parallel connection.

Without wishing to be bound by theory, it is believed that the waveshaping section according to the present invention functions as follows. When an audio input signal is applied at waveshaping section input E which does not differ in voltage from Vref4 by more than the forward voltage drop (diode drop) across diodes D5 or D6, the diodes remain closed. As a result, the waveshaping section acts as an inverting amplifier with a gain of about (−Z7/Z6). However, when peaks of the audio input signal exceed the forward voltage drop (diode drop) across diodes D5 or D6, the diodes conduct current and the waveshaping section becomes a non-inverting amplifier with a gain of about (1+Z7/Z8) and an offset of one diode drop times (1+Z7/Z8+Z7/Z6).

In theory, where D5 and D6 are diodes each having a forward voltage drop of dd and Vref4 is ground, the output voltage (Vout) at waveshaping section output L, for an input voltage (Vin) at waveshaping section input I of between +dd and −dd, is:

$$Vout=Vin(-Z7/Z6)$$

for Vin of greater than +dd, Vout is:

$$Vout=Vin(1+Z7/Z8)-dd(1+Z7/Z8+Z7/Z6)$$

and for Vin of less than −dd, Vout is:

$$Vout=Vin(1+Z7/Z8)+dd(1+Z7/Z8+Z7/Z6)$$

Because the transition of a diode from non-conducting to conducting may not be immediate, the transfer function of Vout as a function of Vin may be rounded for values of Vin close to +dd or −dd.

In some embodiments, (Z7/Z6) is greater than (1+Z7/Z8). In some embodiments, (Z7/Z6) is greater than twice (1+Z7/Z8), or greater than three times (1+Z7/Z8), or greater than four times (1+Z7/Z8).

Further Disclosure Re Musical Distortion Circuits

Any suitable diode or diodes may be used in the practice of the musical distortion circuit with non-limiting clipping section or the musical distortion circuit with waveshaping section according to the present disclosure. A typical diode should have a non-zero diode drop in a forward direction and should pass little or no current in a reverse direction at small voltages. Useful diodes may include Ge diodes, Si diodes, rectifiers, LED's, Schotky diodes, Zener diodes, transistors used as diodes, or vacuum tubes used as diodes. In some embodiments, mixtures of different types of diodes may be used. In some embodiments, two or more diodes in series may be used in place of a single diode. In some embodiments, three or more diodes in various series and (anti-)parallel combinations may be used in place of a pair of diodes. It will be understood that the orientation of signal processing diodes depicted in the figures can be reversed, provided that anti-parallel pairs or groups of diodes remain anti-parallel. Anti-parallel pairs are pairs in opposite orientation, reversed anode-for-cathode. The orientation of a diode used to protect a circuit from accidentally reversed polarity power supply (such as FIG. 9, D7; FIG. 10, D11 and FIG. 11, D18) cannot be reversed.

Typically, the musical distortion circuit with non-limiting clipping section and the musical distortion circuit with waveshaping section according to the present disclosure are physical circuits comprising physical components. In some embodiments, the circuits may be virtual circuits comprising software representations of components. In still other embodiments, a hybrid of virtual and physical circuits may be used.

Any suitable passive components may be used in the practice of the musical distortion circuit with non-limiting clipping section or the musical distortion circuit with waveshaping section according to the present disclosure. Any suitable active components may be used in the practice of the musical distortion circuit with non-limiting clipping section or the musical distortion circuit with waveshaping section according to the present disclosure.

It will be understood that in some embodiments the various sections of circuits according to the present disclosure may be capacitively coupled to adjacent parts. It will be understood that in some embodiments inputs and/or outputs of circuits or sections of circuits according to the present disclosure may be capacitively coupled to adjacent parts.

It will be understood that in some embodiments a complete device embodying circuits according to the present disclosure may include additionally sections, such as one or more power supplies, one or more sources for reference voltages, one or more input and output devices such as jacks, one or more bypass switches or other switches, one or more indicator lights or LED's and associated indicator driver circuits, and the like. Any suitable additional sections may be used.

Objects and advantages of this invention are further illustrated by the following examples, but the particular materials and amounts thereof recited in these examples, as well as other conditions and details, should not be construed to unduly limit this invention.

EXAMPLES

Unless otherwise noted, all components were obtained or are available from Mouser Electronics, Inc., 1000 North Main Street, Mansfield, Tex. 76063-1514. Circuits were built on ordinary two-sided printed circuit boards, which in this case were designed and made using the software and services of ExpressPCB™ (www.expresspcb.com).

Example 1

Figure 9:
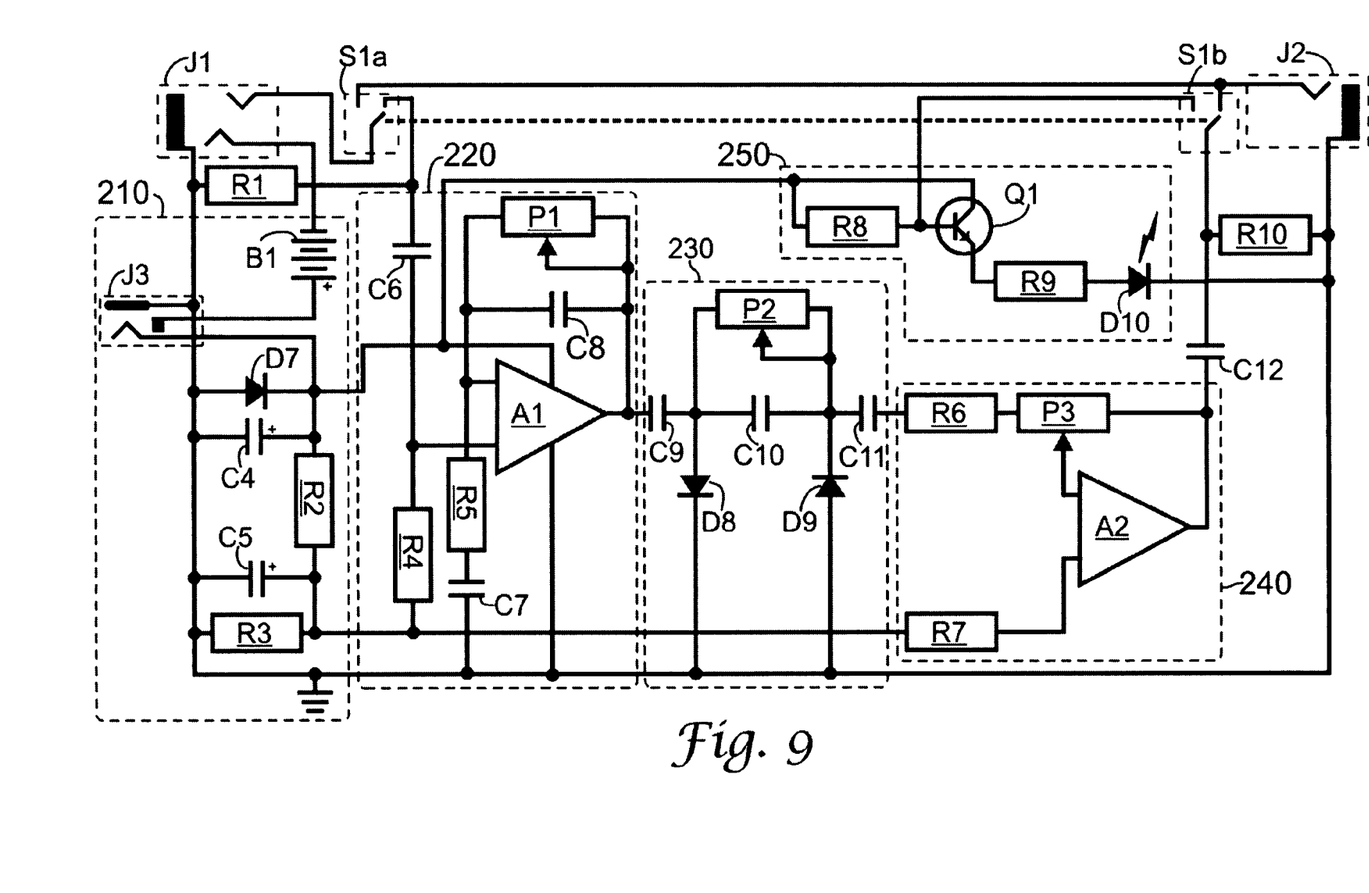
FIG. 9 is a electronic circuit schematic of a device including a non-limiting clipping section according to the present disclosure, as described in Example 1.
Figure 10:
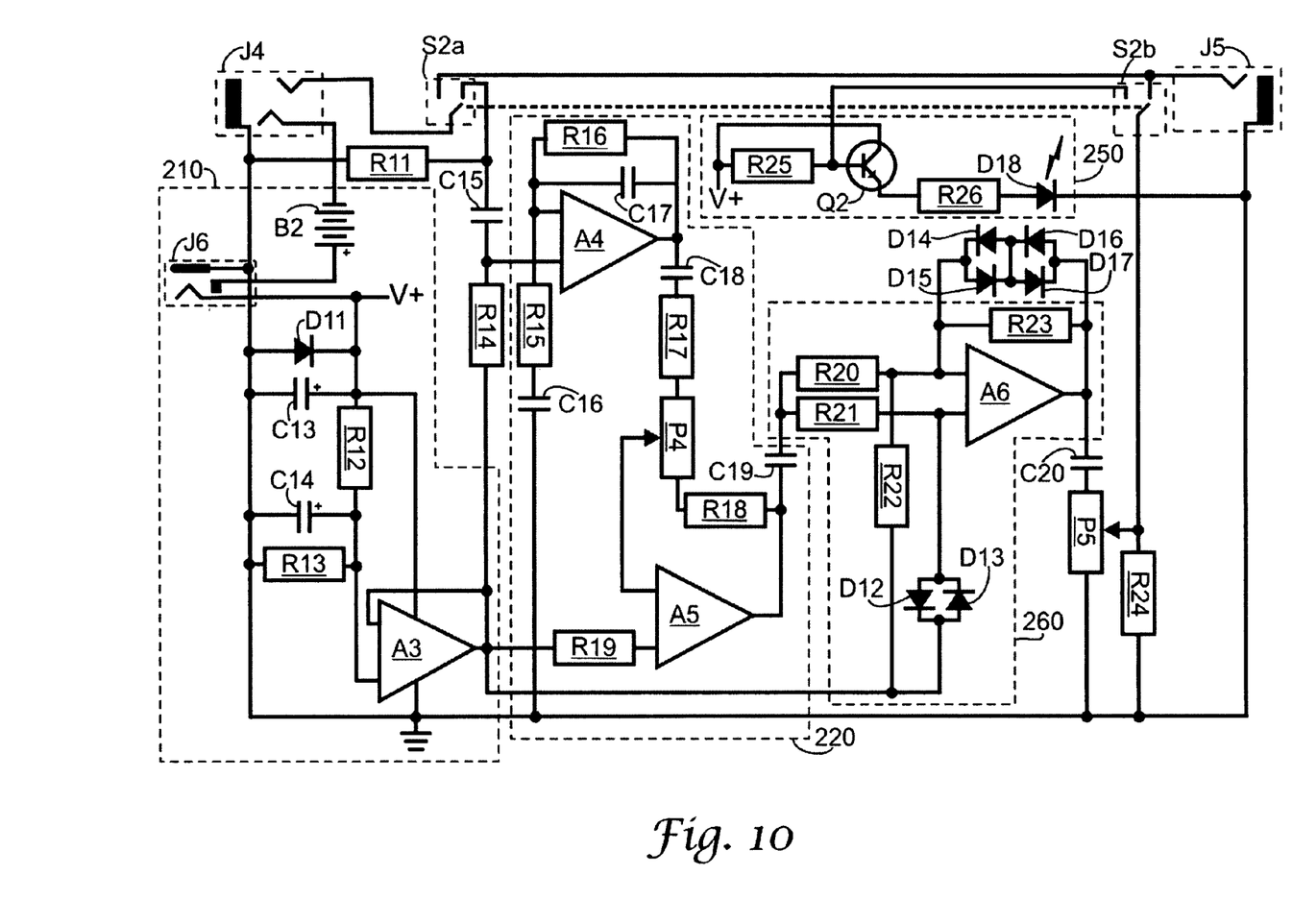
FIG. 10 is a electronic circuit schematic of a device including a Type I waveshaping section according to the present disclosure, as described in Example 2.

The circuit depicted in FIG. 9 was built using the following parts:
R1 and R8: 10M carbon film resistor
R2, R6 and R10: 10 k carbon film resistor
R3: 12 k carbon film resistor
R4: 1M carbon film resistor
R5: 6 k8 carbon film resistor
R7: 100 k carbon film resistor
R9: 1 k carbon film resistor
C4 and C5: 47 microfarad polar electrolytic capacitor
C6 and C9: 0.1 microfarad polyester film capacitor
C7: 0.68 microfarad polyester film capacitor
C8: 56 picofarad ceramic disc capacitor
C10: 1 microfarad non-polar electrolytic capacitor
C11 and C12: 2.2 microfarad non-polar electrolytic capacitor
D7, D8 and D9: 1N4001 Si diode
D10: HLMP3301 5 mm red LED
P1: 100 k linear-taper potentiometer
P2: 100 k linear-taper potentiometer
P3: 10 k linear-taper potentiometer
Q1: 2N5307 Darlington transistor
A1 and A2: each op-amp was one-half of a TL072CP
J1: TRS ¼ inch phone jack
J2: TS ¼ inch phone jack
J3: DC power connector; 2.1 mm ID, 5.5 mm OD
B1: 9 volt battery
S1$a$ and S1$b$: each was one side of a Carling 316-B-PP DPDT pushbutton switch The circuit depicted in FIG. 9 included power supply section 210, input amplifier section 220 which can amplify the input signal and also functions as a band-pass filter, non-limiting clipping section 230, output amplifier section 240, indicator light section 250, input jack J1, output jack J2, and DPDT bypass switch S1$a$/S1$b$. Potentiometer P1 was used to control input gain, potentiometer P2 was used to control dynamics and potentiometer P3 was used to control output volume.

The circuit was tested using both an electric guitar and a waveform generator and the output monitored with an oscilloscope and routed to an amplifier and monitored by ear. The gap between the positive-going and negative-going clipping points was seen to increase with increasing input amplitude as expected. High level inputs and low level inputs were both clipped, but the dynamics were not limited. The sound was fuller and more present than a fully limiting distortion circuit.

Example 2

The circuit depicted in FIG. 10 was built using the following parts:
R11 and R25: 10M carbon film resistor
R12, R15, R17, R21 and R22: 10 k carbon film resistor
R13 and R24: 12 k carbon film resistor
R14: 1M carbon film resistor
R16: 33 k carbon film resistor
R18 and R26: 1 k carbon film resistor
R19: 100 k carbon film resistor
R20: 47 k carbon film resistor
R23: 82 k carbon film resistor
C13 and C14: 47 microfarad polar electrolytic capacitor
C15: 0.1 microfarad polyester film capacitor
C16: 0.022 microfarad polyester film capacitor
C17: 56 picofarad ceramic disc capacitor
C18, C19 and C20: 2.2 microfarad non-polar electrolytic capacitor
D11, D14, D15, D16, and D17: 1N4001 Si diode
D12 and D13: 1N34A Ge diode
D18: HLMP3301 5 mm red LED
P4: 100 k linear-taper potentiometer
P5: 50 k linear-taper potentiometer
Q2: 2N5307 Darlington transistor
A3, A4, A5 and A6: each op-amp was one-quarter of a TL074CN
J4: TRS ¼ inch phone jack
J5: TS ¼ inch phone jack
J6: DC power connector; 2.1 mm ID, 5.5 mm OD
B2: 9 volt battery
S2$a$ and S2$b$: each was one side of a Carling 316-B-PP DPDT pushbutton switch The circuit depicted in FIG. 10 included power supply section 210, input amplifier section 220 which can amplify the input signal and also functions as a band-pass filter, Type I waveshaping section 260, series-anti-parallel post-clipping diodes D14, D15, D16 and D17, indicator light section 250, input jack J4, output jack J5, and DPDT bypass switch S2$a$/S2$b$. Potentiometer P4 was used to control input gain and potentiometer P5 was used to control output volume.

The circuit was tested using both an electric guitar and a waveform generator and the output monitored with an oscilloscope and routed to an amplifier and monitored by ear. The output was seen to be folded over, similar to waveform W of FIG. 8, and at higher gain, folded and post-clipped, similar to waveform X of FIG. 8. A variety of musically interesting sounds were obtained.

Example 3

Figure 11:
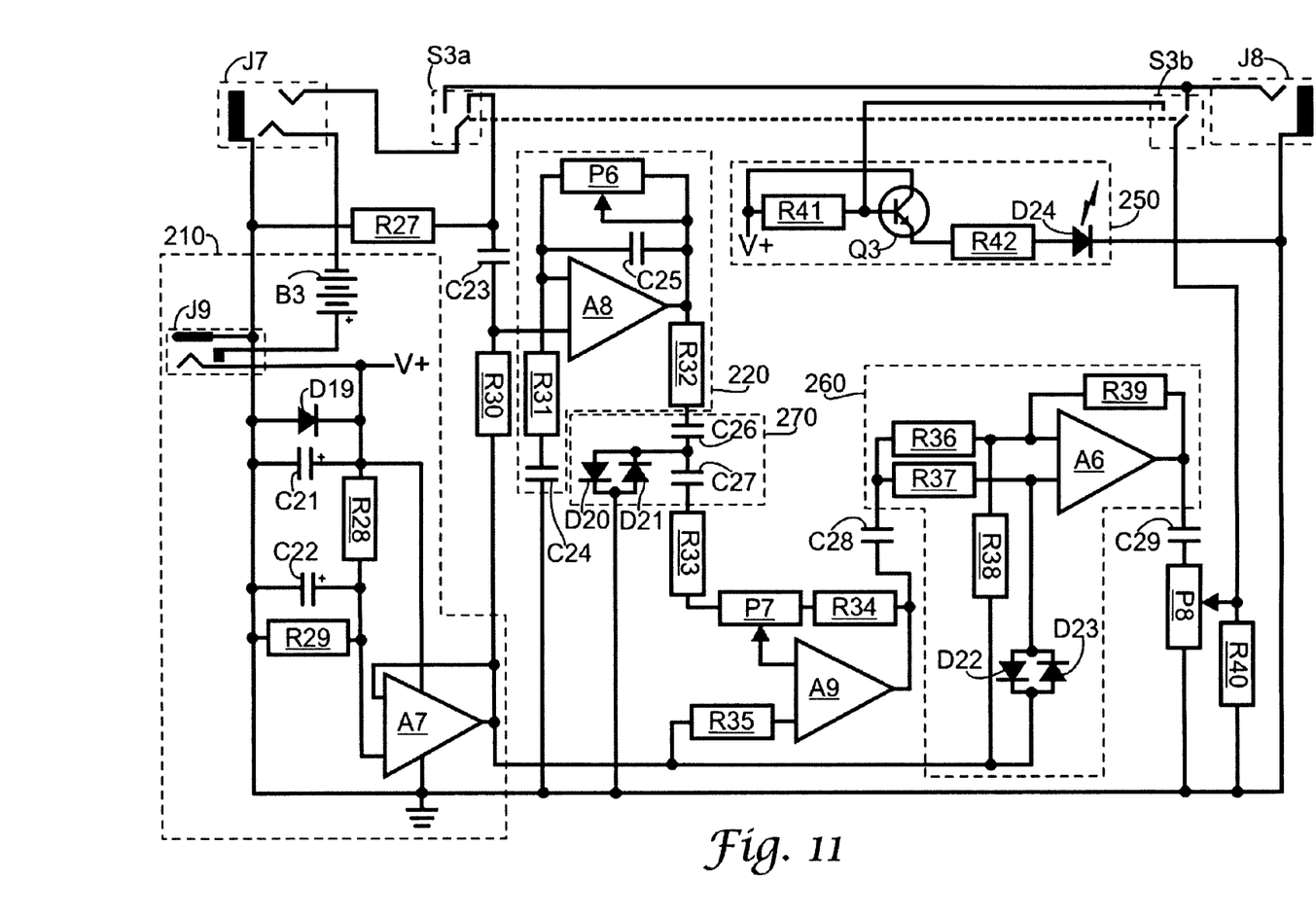
FIG. 11 is a electronic circuit schematic of a device including a Type I waveshaping section according to the present disclosure, as described in Example 3.

The circuit depicted in FIG. 11 was built using the following parts:
R27 and R41: 10M carbon film resistor
R28, R37 and R38: 10 k carbon film resistor
R29 and R40: 12 k carbon film resistor
R30: 1M carbon film resistor
R31: 6.8 k carbon film resistor
R32: 470 ohm carbon film resistor
R33: 22 k carbon film resistor
R34: 27 k carbon film resistor
R35: 100 k carbon film resistor
R36: 47 k carbon film resistor R39: 82 k carbon film resistor
R42: 1 k carbon film resistor
C21 and C22: 47 microfarad polar electrolytic capacitor
C23 and C24: 0.1 microfarad polyester film capacitor
C25: 56 picofarad ceramic disc capacitor
C26, C27 and C28: 10 microfarad non-polar electrolytic capacitor
C29: 2.2 microfarad non-polar electrolytic capacitor
D19, D30, and D21: 1N4001 Si diode
D22 and D23: 1N34A Ge diode
D24: HLMP3301 5 mm red LED
P6: 500 k linear-taper potentiometer
P7: 10 k linear-taper potentiometer
P8: 50 k linear-taper potentiometer
Q3: 2N5307 Darlington transistor
A7, A8, A9 and A10: each op-amp was one-quarter of a TL074CN
J7: TRS ¼ inch phone jack
J8: TS ¼ inch phone jack
J9: DC power connector; 2.1 mm ID, 5.5 mm OD
B3: 9 volt battery
S3a and S3b: each was one side of a Carling 316-B-PP DPDT pushbutton switch The circuit depicted in FIG. 11 included power supply section 210, input amplifier section 220 which can amplify the input signal and also functions as a band-pass filter, pre-clipping section 270, Type I waveshaping section 260, indicator light section 250, input jack J7, output jack J8, and DPDT bypass switch S3a/S3b. Potentiometer P6 was used to control input gain, potentiometer P7 was used to control the degree of waveshaping and potentiometer P8 was used to control output volume.

The circuit was tested using both an electric guitar and a waveform generator and the output monitored with an oscilloscope and routed to an amplifier and monitored by ear. The output was seen to be clipped and folded over, similar to waveform Y of FIG. 8. A variety of musically interesting sounds were obtained. A particularly interesting group of sounds were obtained with P6 and P7 both turned up high. In this case, fundamental frequencies were greatly reduced for loud notes, with the output resembling waveform Z of FIG. 8, however the fundamental frequencies would then return as notes were allowed to decay in amplitude.

Various modifications and alterations of this invention will become apparent to those skilled in the art without departing from the scope and principles of this invention, and it should be understood that this invention is not to be unduly limited to the illustrative embodiments set forth hereinabove.

I claim:

1. A musical distortion circuit comprising a non-limiting clipping section comprising:
   a) a non-limiting clipping section input and a non-limiting clipping section output;
   b) first, second and third capacitors connected in series between the non-limiting clipping section input and the non-limiting clipping section output;
   c) at least one first clipping diode connected between
      1) a point of connection between the first and second capacitors, and
      2) a first reference voltage;
   d) at least one second clipping diode connected between
      1) a point of connection between the second and third capacitors, and
      2) a second reference voltage,
   the first and second clipping diodes being connected in anti-parallel orientation; and
   e) a impedance connected between
      1) the point of connection between the first and second capacitors, and
      2) the point of connection between the second and third capacitors,
   wherein the impedance is a non-zero impedance that is finite at DC.

2. The musical distortion circuit according to claim 1 wherein the impedance is substantially entirely resistive.

3. The musical distortion circuit according to claim 1 wherein the impedance comprises a variable resistance.

4. The musical distortion circuit according to claim 1 additionally comprising:
   f) an input amplifier connected between a musical distortion circuit input and the non-limiting clipping section input; and
   g) an output amplifier connected between the non-limiting clipping section output and a musical distortion circuit output.

5. A musical distortion circuit comprising a waveshaping section comprising:
   a) a waveshaping section input and a waveshaping section output;
   b) a differential amplifier having an inverting amplifier input, a non-inverting amplifier input, and an amplifier output;
   c) a feedback impedance connected between the inverting amplifier input and the amplifier output;
   d) a first input impedance connected between the waveshaping section input and the inverting amplifier input;
   e) a second input impedance connected between the waveshaping section input and the non-inverting amplifier input;
   f) a gain impedance connected between the inverting amplifier input and a reference voltage; and
   g) at least one first diode connected between the non-inverting amplifier input and the reference voltage.

6. The musical distortion circuit according to claim 5 wherein said at least one first diode comprises at least two anti-parallel diodes.

7. The musical distortion circuit according to claim 5 additionally comprising:
   h) at least one second diode connected between the inverting amplifier input and the amplifier output.

8. The musical distortion circuit according to claim 7 wherein said at least one second diode comprises at least two anti-parallel diodes.

9. The musical distortion circuit according to claim 5 wherein the first input impedance, the second input impedance, the gain impedance and the feedback impedance are substantially entirely resistive.

10. The musical distortion circuit according to claim 5 wherein the ratio of the feedback impedance to the first input impedance is less than one plus the ratio of the feedback impedance to the gain impedance.

11. The musical distortion circuit according to claim 9 wherein the ratio of the feedback impedance to the first input impedance is less than two plus twice the ratio of the feedback impedance to the gain impedance.

12. The musical distortion circuit according to claim 5 additionally comprising:
   i) an input amplifier connected between a musical distortion circuit input and the waveshaping section input; and
   j) an output amplifier connected between the waveshaping section output and a musical distortion circuit output.

13. The musical distortion circuit according to claim 5 additionally comprising:

k) a distortion section connected between a musical distortion circuit input and the waveshaping section input.

14. A musical distortion circuit comprising a waveshaping section comprising:
- a) a waveshaping section input and a waveshaping section output;
- b) a differential amplifier having an inverting amplifier input, a non-inverting amplifier input, and an amplifier output;
- c) a feedback impedance connected between the inverting amplifier input and the amplifier output;
- d) an input impedance connected between the waveshaping section input and the inverting amplifier input;
- e) a gain impedance connected between the inverting amplifier input and a reference voltage;
- f) a reference impedance connected between the non-inverting amplifier input and the reference voltage; and
- g) at least one first diode connected between the waveshaping section input and the non-inverting amplifier input.

15. The musical distortion circuit according to claim 14 wherein said at least one first diode comprises at least two anti-parallel diodes.

16. The musical distortion circuit according to claim 14 additionally comprising:
- h) at least one second diode connected between connected between the inverting amplifier input and the amplifier output.

17. The musical distortion circuit according to claim 14 wherein the input impedance, the gain impedance, the feedback impedance and the ground impedance are substantially entirely resistive.

18. The musical distortion circuit according to claim 14 wherein the ratio of the feedback impedance to the input impedance is greater than one plus the ratio of the feedback impedance to the gain impedance.

19. The musical distortion circuit according to claim 17 wherein the ratio of the feedback impedance to the input impedance is greater than two plus twice the ratio of the feedback impedance to the gain impedance.

20. The musical distortion circuit according to claim 14 additionally comprising:
- j) a distortion section connected between a musical distortion circuit input and the waveshaping section input.

* * * * *